United States Patent
Pham

(10) Patent No.: US 6,952,124 B2
(45) Date of Patent: Oct. 4, 2005

(54) PHASE LOCKED LOOP CIRCUIT WITH SELF ADJUSTED TUNING HIEP THE PHAM

(75) Inventor: Hiep The Pham, Campbell, CA (US)

(73) Assignee: Silicon Bridge, Inc., Fremont, CA (US)

( * ) Notice: Subject to any disclaimer, the term of this patent is extended or adjusted under 35 U.S.C. 154(b) by 23 days.

(21) Appl. No.: 10/662,554

(22) Filed: Sep. 15, 2003

(65) Prior Publication Data

US 2005/0057289 A1 Mar. 17, 2005

(51) Int. Cl.[7] ............................................. H03L 7/06
(52) U.S. Cl. ...................... 327/156; 327/162; 327/148
(58) Field of Search ................................ 327/156, 157, 327/162, 163, 146–148, 3, 5, 7, 12, 40, 42–44, 47–49, 71–77; 331/DIG. 2, 1 A, 1 R; 375/373–376

(56) References Cited

U.S. PATENT DOCUMENTS

| | | | | |
|---|---|---|---|---|
| 5,382,922 A | * | 1/1995 | Gersbach et al. ............ 331/1 A |
| 5,696,468 A | * | 12/1997 | Nise .............................. 331/14 |
| 5,805,024 A | * | 9/1998 | Takashi et al. ............... 331/17 |
| 5,867,333 A | * | 2/1999 | Saiki et al. .................... 360/51 |
| 6,043,717 A | * | 3/2000 | Kurd ............................. 331/17 |
| 6,064,947 A | * | 5/2000 | Sun et al. ..................... 702/106 |
| 6,188,289 B1 | * | 2/2001 | Hyeon .......................... 331/17 |
| 6,215,364 B1 | * | 4/2001 | Hwang et al. ................ 331/57 |
| 6,330,296 B1 | * | 12/2001 | Atallah et al. ............... 375/376 |
| 6,356,158 B1 | * | 3/2002 | Lesea ........................... 331/11 |
| 6,462,594 B1 | * | 10/2002 | Robinson et al. ........... 327/159 |
| 6,667,640 B2 | * | 12/2003 | Asano .......................... 327/147 |

* cited by examiner

Primary Examiner—Timothy P. Callahan
Assistant Examiner—Hai L. Nguyen

(57) ABSTRACT

A phase-locked loop (PLL) circuit includes a voltage-controlled oscillator (VCO) having a first input to receive a control voltage, one or more second inputs to receive one or more tuning range control signals, and an output to provide an oscillation output signal, a phase detector having inputs to receive the oscillation output signal and a reference signal, a charge pump having an input coupled to the output of the phase detector and having an output to generate the control voltage, a loop filter having an input to receive the control voltage and having a control terminal, and a controller having inputs to receive the control voltage, a high reference voltage, a low reference voltage, and one or more mode signals, and having a first output connected to the control terminal of the loop filter and second outputs to generate the tuning range signals.

34 Claims, 7 Drawing Sheets

PHASE LOCKED LOOP CIRCUIT WITH SELF ADJUSTED TUNING HIEP THE PHAM

FIELD OF INVENTION

The present invention relates generally to integrated circuits and specifically to phase locked loops.

DESCRIPTION OF RELATED ART

Phase locked loop (PLL) circuits are well-known circuits that are used, for example, in clock recovery and frequency synthesizing applications. PLL circuits produce an output signal that is synchronized with an input signal, e.g., the frequency of the output signal and the frequency of the input signal maintain a fixed ratio and output signal has a fixed phase relationship with the input signal. FIG. 1 shows a prior art PLL circuit 100 having a phase detector 102, a charge pump and loop filter circuit 104, a voltage-controlled oscillator (VCO) 106, and an optional frequency divider 108. Phase/Frequency detector 102 includes inputs to receive a reference signal $f_{REF}$ from an external source (not shown) and a feedback signal from the VCO 104, and includes an output coupled to the charge pump and loop filter circuit 104. Phase/Frequency detector 102 detects the difference in phase between its input signals and, in response thereto, generates a phase difference signal 10. In response to the phase difference signal 10, the charge pump charges and discharges one or more capacitors in the loop filter to generate a voltage control signal V_ctrl. The loop filter together with the charge pump serves as an infinite gain integrator and also introduces a zero to stabilize the system. V_ctrl is then provided as a control signal to VCO 106. In response to V_ctrl, VCO 106 adjusts the frequency of $f_{VCO}$ until $f_{VCO}$ is synchronized with $f_{REF}$, at which point the PLL circuit 100 locks to maintain a fixed phase relationship between $f_{VCO}$ and $f_{REF}$.

The PLL circuit 100 is shown in FIG. 1 to include the optional frequency divider circuit 108, which generates a frequency signal 12 by dividing $f_{VCO}$ by a predetermined multiple. The frequency signal 12 is provided as the feedback signal to be compared with $f_{REF}$ in the phase detector 102. For implementations that do not include frequency divider 108, $f_{VCO}$ is provided directly to the phase detector 102.

The VCO 106 has a gain factor $K_{VCO}$ that defines the linear relationship between V_ctrl and $f_{VCO}$ where, as illustrated in FIG. 2, an increase in V_ctrl causes an increase in $f_{VCO}$ by V_ctrl*$K_{VCO}$ and a decrease in V_ctrl causes a decrease in $f_{VCO}$ by V_ctrl*$K_{VCO}$. Thus, the gain factor $K_{VCO}$ of VCO 106 determines the tuning range for the PLL circuit 100. Accordingly, to cover a larger frequency range with a smaller control voltage for high speed applications and/or low supply voltages, $K_{VCO}$ should be large so that small changes in V_ctrl result in large changes in $f_{VCO}$.

However, as known in the art, a large $K_{VCO}$ increases noise sensitivity of the PLL circuit, and is thus undesirable. Further, with a relatively low gain $K_{VCO}$, the loop filtering operation becomes more predictable and stable. Thus, although desirable for noise sensitivity reduction and stability, a low $K_{VCO}$ limits the tuning range of the PLL circuit. For example, referring to FIG. 2, varying V_ctrl between a lower level $V_L$ and an upper level $V_H$ results in $f_{VCO}$ varying between a lower frequency $f_{min}$ and a higher frequency $f_{max}$, where the center frequency $f_c$ is designated as the frequency of $f_{VCO}$ which corresponds to V_ctrl being halfway between $V_L$ and $V_H$, e.g., $f_c = V_M * K_{VCO}$, where $V_H - V_M$ is equal to $V_M - V_L$. Thus, decreasing the slope $K_{VCO}$ would cause variations in V_ctrl to effect smaller variations in $f_{VCO}$.

As a result, there is a need for a stable PLL circuit that has a large tuning range suitable for high speed applications.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

In accordance with the present invention, a PLL circuit is disclosed that includes a VCO having a resonant circuit with a plurality of individually selectable capacitive elements corresponding to various different tuning ranges, and including a control circuit that selects one of the tuning ranges in response to either externally generated or internally generated control signals. In the following description, exemplary embodiments are described in order to provide a thorough understanding of the present invention. For purposes of explanation, specific nomenclature is set forth to provide a thorough understanding of the present invention. However, it will be apparent to one skilled in the art that these specific details may not be required to practice the present invention. In other instances, well-known circuits and devices are shown in block diagram form to avoid obscuring the present invention unnecessarily. Additionally, the interconnection between circuit elements or blocks may be shown as buses or as single signal lines. Each of the buses may alternatively be a single signal line, and each of the single signal lines may alternatively be a bus. Further, the logic states of various signals described herein are exemplary and therefore may be reversed or otherwise modified as generally known in the art. Accordingly, the present invention is not to be construed as limited to specific examples described herein but rather includes within its scope all embodiments defined by the appended claims.

Figure 3:
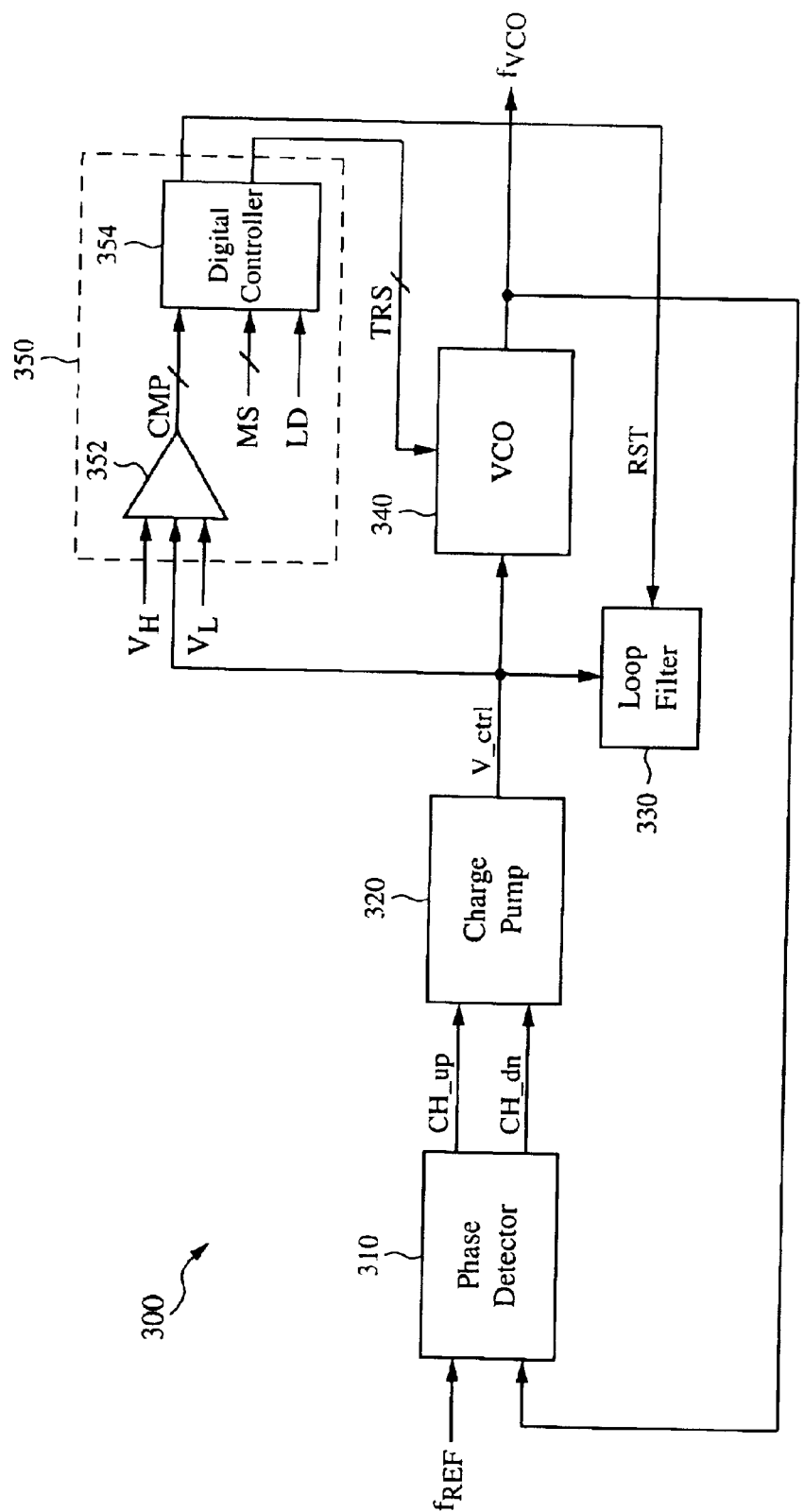
FIG. 3 is a block diagram of a PLL circuit in accordance with the present invention.

FIG. 3 shows a PLL circuit 300 in accordance with one embodiment of the present invention. PLL circuit 300 includes a phase detector 310, a charge pump 320, a loop filter 330, a VCO 340, and a control circuit 350. Phase/Frequency detector 310, which may be any well-known phase/Frequency detector, compares the phase of a reference signal $f_{REF}$ and the VCO output signal $f_{VCO}$ to generate control signals CH_up and CH_dn, which are provided as inputs to charge pump 320. Charge pump 320, which may be any well-known charge pump, generates a voltage control signal V_ctrl in response to CH_up and CH_dn. For some embodiments, charge pump 320 generates V_ctrl by charging and discharging one or more capacitors in loop filter 330 in response to CH_up and CH_dn, respectively.

Loop filter 330 smoothes the control voltage V_ctrl generated by charge pump 320 in a well-known manner. For some preferred embodiments, loop filter 330 is a well-known second order loop filter that introduces a zero to stabilize the closed loop and to make the filter operate as a two pole-one zero system. The second pole of the loop filter smoothes the control voltage Vctrl. For one embodiment, loop filter 330 creates a first pole at approximately 1.2 MHz, a zero at approximately 1.17 MHz, and a second pole at approximately 4.0 MHz. For other embodiments, loop filter 330 is a well-known low pass filter, although other filters may be used. Further, in accordance with the present invention, loop filter 330 includes a control terminal to receive a reset signal RST that, when asserted, causes loop filter 330 to reset V_ctrl to a predetermined value. For some embodiments, RST is generated by control circuit 350, as described below. For other embodiments, RST may be generated by another logic circuit such as, for example, phase detector 310.

VCO 340 includes a first input to receive the control voltage V_ctrl, second inputs to receive one or more tuning range control signals TRS from the control circuit 350, and an output to provide the VCO output signal $f_{VCO}$. In accordance with the present invention, VCO 340 is a differential oscillator including a tunable inductor-capacitor (LC) tank circuit (not shown in FIG. 3 for simplicity) that may be configured by signals TRS to select one of a plurality of different frequency tuning ranges for $f_{VCO}$. In operation, a desirable tuning range is first selected using signals TRS, then the oscillation frequency is synchronized to $f_{REF}$ by adjusting V_ctrl. Other types of VCO circuits that allow for frequency range adjustments can be used. For other embodiments, a current controlled oscillator (ICO) can be used with a voltage-to-current converter.

Control circuit 350 includes a comparator 352 and a digital controller 354. Comparator 352, which is well-known, includes inputs to receive V_ctrl, an upper limit voltage signal $V_H$, and a lower limit voltage signal $V_L$. For one embodiment, where a supply voltage $V_{DD}$ of 1.5 volts is utilized for PLL circuit 300, $V_L$ is approximately 0.45 volts and $V_H$ is approximately 0.95 volts. Comparator 352 compares V_ctrl to $V_L$ and $V_H$, and in response thereto generates compare signals CMP_up and CMP_dn. In addition, for some embodiments, comparator 352 also compares V_ctrl with a middle voltage $V_M$ to generate a third compare signal CMP_mid. The voltage $V_M$, which for preferred embodiments is the voltage midway between $V_H$ and $V_L$, i.e., $V_M=(V_H+V_L)/2$, may be generated in a well known manner, for example, using a voltage divider. Signals CMP_un, CMP_dn, and CMP_mid are shown collectively in FIG. 3 as CMP.

Digital controller 354 includes inputs to receive the CMP signals, the voltage control signal V_ctrl, a lock detect signal LD, and one or more mode select signals MS. For some embodiments, mode select signals MS are externally generated signals provided, for example, by a user of PLL circuit 300. As described in detail below, digital controller 354 generates the tuning range control signals TRS in response to its input signals CMP, LD, and MS.

Figure 1:
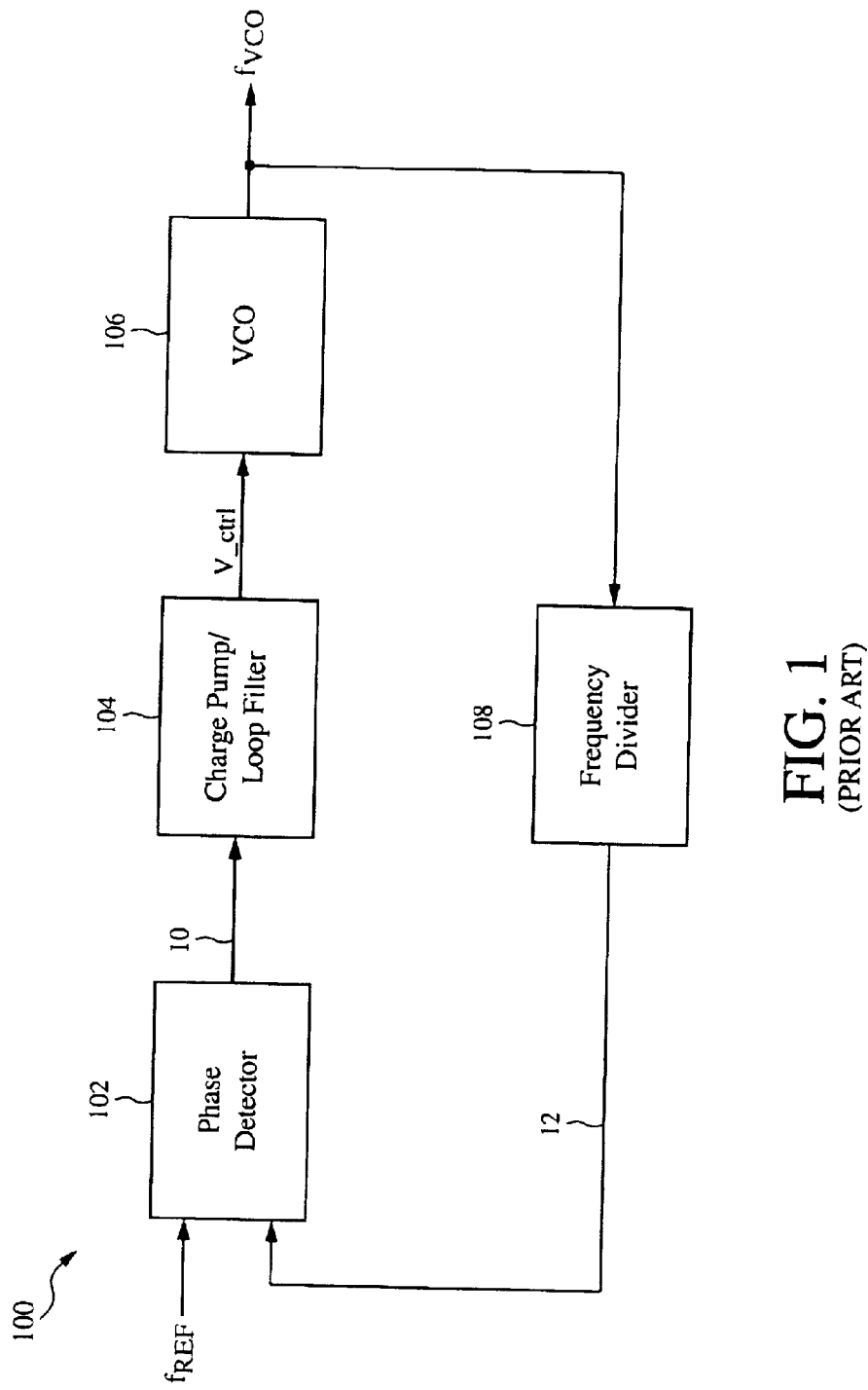
FIG. 1 is a block diagram of a prior art phase locked loop (PLL) circuit.
Figure 2:
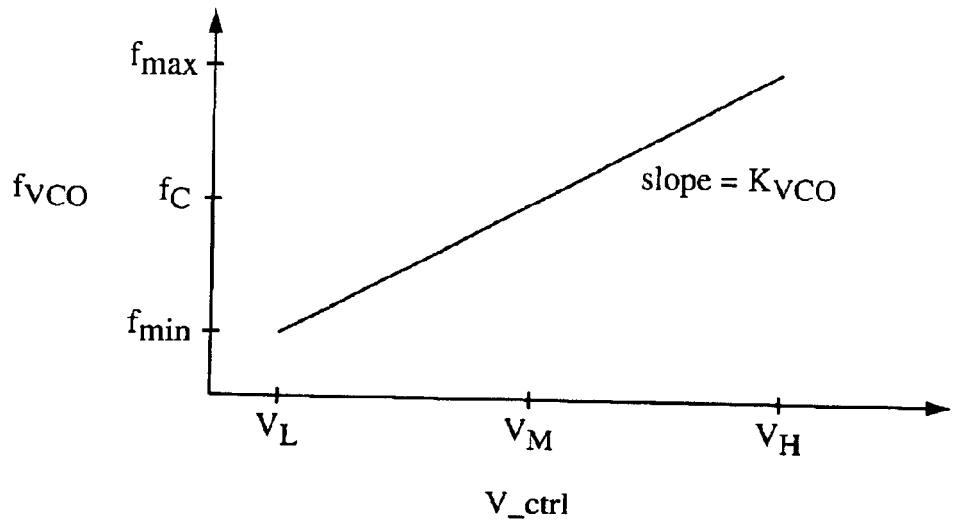
FIG. 2 is a graph illustrating the relationship between the VCO control voltage ($V_{CTRL}$) and the VCO output signal ($f_{VCO}$) for the prior art PLL circuit of FIG. 1.

Although not shown for simplicity, preferred embodiments of FIG. 3 may include a well-known buffer connected between loop filter 330 and VCO 340 to isolate VCO 340 from the capacitance of loop filter 330 and/or charge pump 320. In addition, although not shown in FIG. 3 for simplicity, each component of PLL circuit 300 includes power terminals connected to first and second voltage supplies (e.g., $V_{DD}$ and ground potential), and includes a clock input to receive a clock signal. In addition, although not shown in FIG. 3, some embodiments of PLL circuit 300 may include a well-known frequency divider circuit (e.g., frequency divider 108 of FIG. 1) connected between VCO 340 and phase detector 310.

Figure 4:
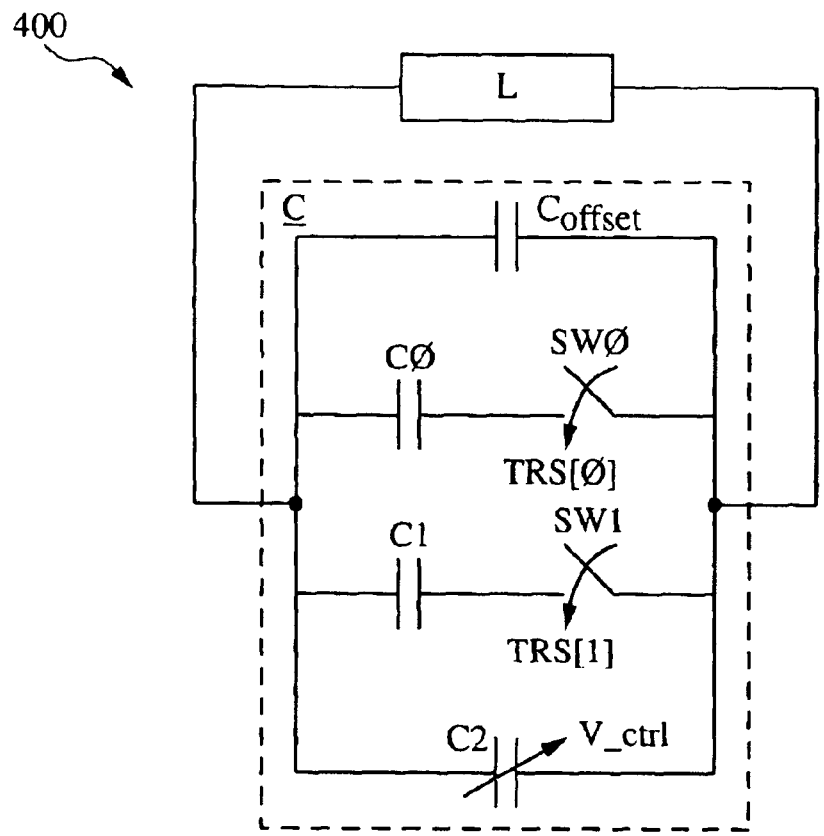
FIG. 4 is a schematic diagram of an exemplary embodiment of a resonant circuit employed in the VCO of FIG. 3.

FIG. 4 shows an exemplary embodiment of the tunable resonant circuit included within VCO 340. As shown in FIG. 4, the resonant circuit is an LC tank circuit 400 that includes an inductive element L connected in parallel with a tunable capacitive element C. Tunable capacitive element C includes an offset capacitor $C_{offset}$, two capacitive elements C0 and C1 that may be selectively connected in parallel with $C_{offset}$ via switches SW0 and SW1, respectively, and a variable capacitance (e.g., a varactor) C2 controlled by V_ctrl. The offset capacitor $C_{offset}$ provides a minimum capacitance across inductor L, and thereby sets a minimum or offset oscillation frequency for tank circuit 400. The switches SW0 and SW1, which are controlled by tuning range control signals TRS[0] and TRS[1], respectively, may be selectively enabled to effect large changes in capacitance across the inductor L. The varactor capacitance C2 may be adjusted by V_ctrl to effect small changes in capacitance across the inductor L.

Specifically, tank circuit 400 has a resonant frequency $f_o$ given by the expression:

$$fo = \frac{1}{2\pi\sqrt{LC}},$$

where C is the total capacitance of tank circuit 400 and L is the total inductance of tank circuit 400. Thus, when switches SW0 and SW1 are enabled, thereby connecting both C0 and C1 across $C_{offset}$, tank circuit 400 is in a first state and has capacitance equal to $C_{offset}$+C0+C1+C2, which gives a resonant frequency $$fo = \frac{1}{2\pi\sqrt{L(Coffset + C0 + C1 + C2)}}.$$

When only switch SW0 is enabled, thereby connecting C0 but not C1 across $C_{offset}$, tank circuit 400 is in a second state and has capacitance equal to $C_{offset}$+C0+C2, which gives a resonant frequency $$fo = \frac{1}{2\pi\sqrt{L(Coffset + C0 + C2)}}.$$

When switches SW0 and SW1 are both disabled, thereby not connecting C0 or C1 across $C_{offset}$, tank circuit 400 is in a third state and has capacitance equal to $C_{offset}$+C2, which gives a resonant frequency $$fo = \frac{1}{2\pi\sqrt{L(C_{offset} + C2)}}.$$

In this manner, switches SW0 and SW1 may be selectively enabled to select between three different frequency tuning ranges, where the output frequency within each of the selected ranges may be adjusted by V_ctrl.

For preferred embodiments, capacitors C0 and C1 are the same value so that the effective capacitance of tank circuit 400 is the same whether (1) C0 but not C1 is connected across $C_{offset}$ or (2) C1 but not C0 is connected across $C_{offset}$. For such embodiments, asserting only SW0 or asserting only SW1 results in the frequency tuning range. For other embodiments, capacitors C0 and C1 may be different values so that the effective capacitance of tank circuit is a different value when SW1 is asserted but not switch SW0, thereby resulting in a fourth frequency tuning range.

Figure 5:
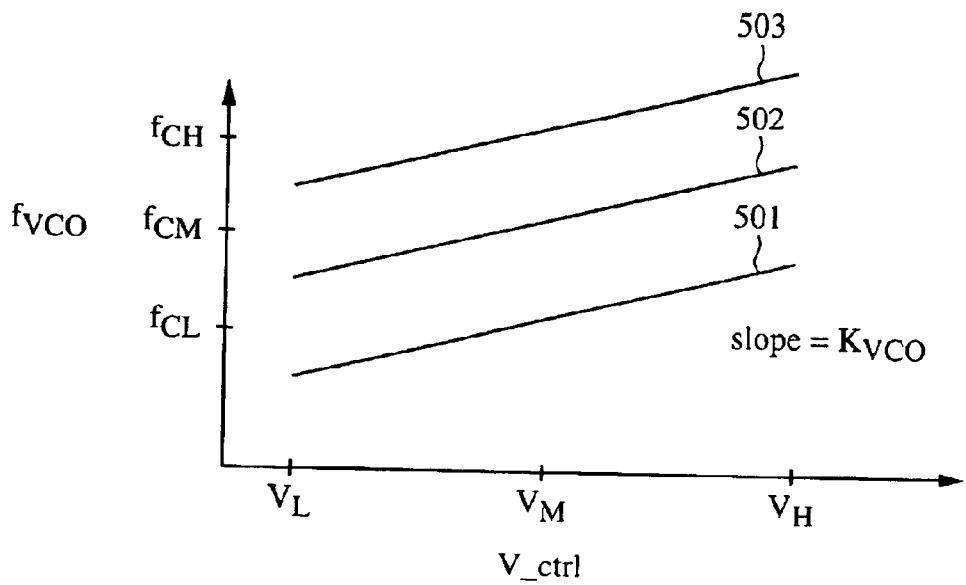
FIG. 5 is a graph illustrating the relationship between the VCO control voltage and the VCO output signal for a family of tuning ranges for the PLL circuit of FIG. 3.

FIG. 5 shows three graphs 501–503 depicting three frequency adjacent tuning ranges which correspond to the exemplary tank circuit 400 of FIG. 4 in which C0 is the same as C1. Specifically, the lower range 501 corresponds to the first state of tank circuit 400, the middle range 502 corresponds to the second state of tank circuit 400, and the upper range 503 corresponds to the third state of tank circuit 400. For each of the ranges 501–503, the control voltage V_ctrl may vary between a lower limit $V_L$ and an upper limit $V_H$ to adjust the output frequency $f_{VCO}$ around the range's center frequency, where the center frequency $f_{c1}$ for the lower tuning range 501 is achieved when V_ctrl equals a middle voltage $V_M$, the center frequency $f_{cm}$ for the middle tuning range 502 is achieved when V_ctrl equals $V_M$, and the center frequency $f_{ch}$ for the upper tuning range 503 is achieved when V_ctrl equals $V_M$.

In accordance with the present invention, the three tuning ranges 501–503 are selected to overlap one another so that some resonant frequencies may be achieved while VCO 340 in either of two adjacent tuning ranges. The overlapping of adjacent tuning ranges ensures that synchronization between $f_{VCO}$ and $f_{REF}$ occurs when V_ctrl is not at the upper voltage limit $V_H$ or the lower voltage limit $V_L$. In this manner, after lock detect occurs, the control voltage V_ctrl may still be varied to adjust $f_{VCO}$ in response to temperature and/or process variations.

Referring also to FIG. 3, switches SW0 and SW1 of tank circuit 400 are controlled by corresponding tuning range control bits TRS[0] and TRS[1], respectively, which are provided by control circuit 350. Table 1 below summarizes the selection of frequency tuning ranges using the TRS bits.

TABLE 1

| TRS[0, 1] | tuning range |
|---|---|
| 00 | reserved |
| 01 | lower range |
| 10 | middle range |
| 11 | upper range |

The signals TRS[0] and TRS[1] may be generated automatically by control circuit 350, or may be generated externally to PLL circuit 300 and provided as mode input signals MS to control circuit 350. For the exemplary embodiment, controller 354 is configured to receive two mode signals MS[0] and MS[1] which collectively select one of four modes for controller 354, where a first mode instructs controller 354 to automatically select one of tuning ranges 501–503 for VCO 340, a second mode instructs controller 354 to select the lower frequency range 501 for VCO 340, a third mode instructs controller 354 to select the middle frequency range 502 for VCO 340, and a fourth mode instructs controller 354 to select the upper frequency range 503 for VCO 340. Selection of the four modes by mode bits MS is summarized below in Table 2.

TABLE 2

| MS[0, 1] | tuning range |
|---|---|
| 00 | automatically select |
| 01 | lower range |
| 10 | middle range |
| 11 | upper range |

Operation of the exemplary embodiment is described below with reference to FIGS. 3–5, where PLL circuit 300 is configured to operate in automatic mode by setting MS[0,1]=00. For the example described below, the TRS signals output from controller 354 are initially set to select the middle frequency range 502 for VCO 340, e.g., TRS[0, 1]=10. As indicated above, setting TRS[0,1]=10 enables switch SW0 and disables switch SW1 to connect C0 but not C1 across $C_{offset}$. Of course, for actual embodiments, controller 354 may be initialized to select any of the selected tuning ranges 501–503. For a preferred embodiment, controller 354 is initialed to select the lower tuning range 501.

In operation, phase detector 310 compares the reference signal $f_{REF}$ with the VCO output signal $f_{VCO}$. If the phase of $f_{VCO}$ is less than that of $f_{REF}$, phase detector 310 asserts CH_up (e.g., to logic high), which in turn causes charge pump 320 to charge V_ctrl toward $V_H$. The increasing value of $V_{13}$ ctrl causes VCO 340 to increase the frequency of $f_{VCO}$ toward $f_{REF}$. Conversely, if the phase of $f_{VCO}$ is greater than that of $f_{REF}$, phase detector asserts CH_dn (e.g., to logic high), which in turn causes charge pump 320 to discharge V_ctrl toward $V_L$. The decreasing value of V_ctrl causes VCO 340 to decrease the frequency of $f_{VCO}$ toward $f_{REF}$. Charge pump 320 adjusts V_ctrl in response to the phase detector output to adjust $f_{VCO}$ along middle tuning range 502 until either (1) $f_{VCO}$ is synchronized with $f_{REF}$, (2) V_ctrl drops below $V_L$, or (3) V_ctrl exceeds $V_H$.

If $f_{VCO}$ synchronizes with $f_{REF}$ while the middle tuning range 502 is selected, the lock detect signal LD is asserted in a well-known manner to indicate that $f_{VCO}$ is in a fixed phase relationship with $f_{REF}$. Assertion of the lock detect signal LD instructs controller 354 to maintain signals TRS in their present state, thereby locking the VCO 340 to the selected frequency range 502.

If V_ctrl drops below $V_L$, comparator 352 asserts compare signal CMP_dn (e.g., to logic high), which in turn instructs controller 354 to select the next lower tuning range. Thus, for this example, asserting CMP_dn causes controller 354 to set TRS[0,1]=01 which, as indicated above, selects the lower tuning range 501 by enabling switches SW0 and SW1 to connect both C0 and C1 across $C_{offset}$. Also, the assertion of CMP_dn instructs controller 354 to assert (e.g., to logic high) the reset signal RST, which in turn causes loop filter 330 to reset V_ctrl to $V_M$. In this manner, the VCO output $f_{VCO}$ is set to the center frequency $f_{c1}$ of the lower tuning range 501, thereby ensuring that $f_{VCO}$ does not decrease (e.g., slower phase differential) during the transition to the lower tuning range. Thereafter, V_ctrl is adjusted as described above to adjust $f_{VCO}$ along tuning range 501 until the lock detect condition occurs. If lock detect does not occur, i.e., V_ctrl drops below $V_L$ while the lower tuning range 501 is selected, PLL circuit 300 is out of range.

If V_ctrl exceeds $V_H$, comparator 352 asserts compare signal CMP_up (e.g., to logic high), which in turn instructs controller 354 to select the next higher tuning range. Thus, for this example, asserting CMP_up causes controller 354 to set TRS[0,1]=11 which, as indicated above, selects the upper tuning range 503 by disabling switches SW0 and SW1 to de-couple C0 and C1 from tank circuit 400. Also, the assertion of CMP_up instructs controller 354 to assert the reset signal RST, which in turn causes loop filter 330 to reset V_ctrl to $V_M$. In this manner, the VCO output $f_{VCO}$ is set to the center frequency $f_{ch}$ of the upper tuning range 503, thereby ensuring that $f_{VCO}$ does not increase (e.g., faster phase differential) during the transition to the higher tuning range. Thereafter, V_ctrl is adjusted as described above to adjust $f_{VCO}$ along tuning range 503 until the lock detect condition occurs. If lock detect does not occur, i.e., V_ctrl exceeds $V_H$ while the upper tuning range 503 is selected, PLL circuit 300 is out of range.

For some embodiments, comparator 352 includes utilizes hysteresis during compare operations between V_ctrl and $V_H$, $V_L$. For example, for one embodiment, comparator 352 asserts CMP_up when V_ctrl comes within a predetermined voltage of $V_H$ and, conversely, asserts CMP_dn when V_ctrl comes within a predetermined voltage of $V_L$. In this manner, inadvertent oscillations may be prevented.

Figure 6:
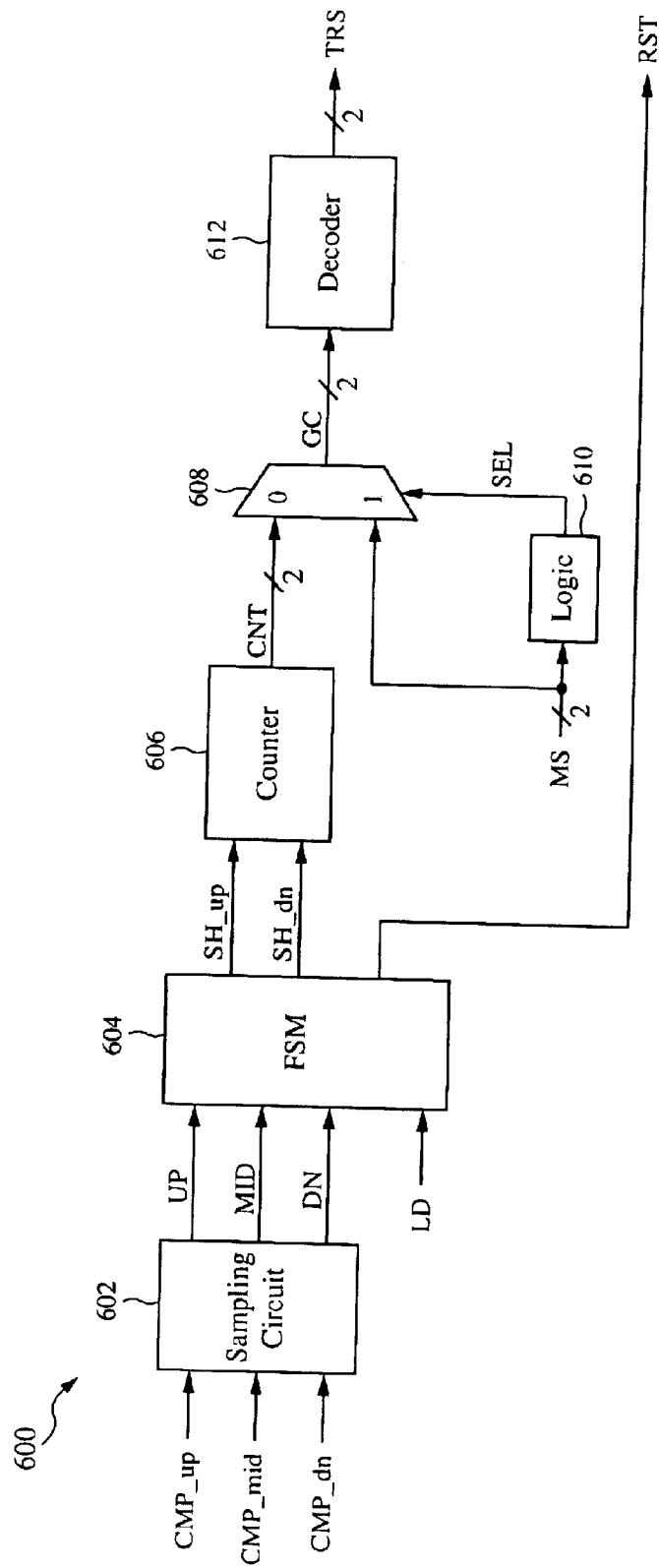
FIG. 6 is a simplified block diagram of one embodiment of the digital controller employed in the PLL circuit of FIG. 3.

FIG. 6 shows a controller 600 that is one embodiment of controller 354 of FIG. 3. Controller 600 includes a sampling circuit 602, a finite state machine (FSM) 604, a counter 606, a multiplexer (MUX) 608, a logic gate 610, and a decoder 612. Sampling circuit 602, which is well-known, samples input signals CMP_up, CMP_dn, and CMP_mid provided by comparator 352 (see also FIG. 3) to generate corresponding output signals UP, DN, and MID, respectively. For some embodiments, sampling circuit 602 asserts each of its output signals only if the corresponding CMP input signal is asserted for a predetermined number of clock cycles (e.g., two clock cycles for a preferred embodiment). In this manner, sampling circuit 602 prevents temporary overshoots and/or undershoots in V_ctrl from causing inadvertent transitions between tuning ranges 501–503. For example, when adjusting V_ctrl to tune $f_{VCO}$ to a desired frequency, V_ctrl may temporarily exceed (e.g., overshoot) $V_H$ but then quickly settle to a value that is less than $V_H$. By sampling CMP_up multiple times, sampling circuit 602 does not assert the output signal CMP_up, and thus does not erroneously cause a transition between frequency ranges 501–503.

Figure 8:
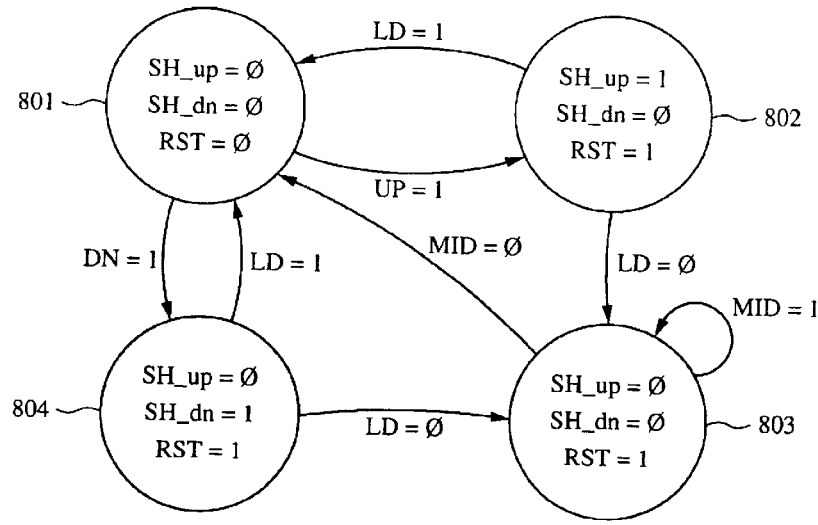
FIG. 8 is a state diagram for one embodiment of the finite state machine employed in the digital controller of FIG. 6.

FSM 604 includes inputs to receive the lock detect signal LD and the sampled compare signals UP, DN, and MID, and includes outputs to provide shift signals SH_up and SH_dn to counter 606 and the reset signal RST to loop filter 330. FSM 604 is configured to implement the state diagram of FIG. 8. It is to be understood that numerous logic circuits may be used to implement the state diagram of FIG. 8, and therefore specific circuit configurations of FSM 604 are not provided herein so as to not unnecessarily obscure the invention. Counter 606, which may be any well-known binary counter, includes inputs to receive SH_up and SH_dn from FSM 604 and an output to generate a 2-bit counter signal CNT. For some embodiments, counter 606 increments its output CNT if SH_up is asserted, and decrements CNT if SH_dn is asserted.

Figure 7:
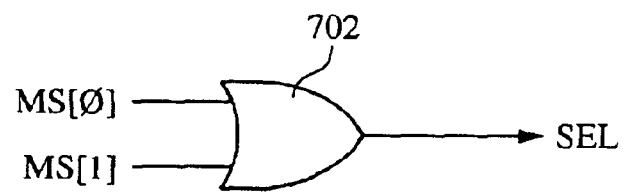
FIG. 7 is a block diagram for one embodiment of the logic gate employed in the digital controller of FIG. 6.

MUX 608, which is well-known, includes a first input to receive CNT[0,1] from counter 606, a second input to receive the 2-bit mode signal MS[0,1], an output to provide control signals GC[0,1] to decoder 612, and a control terminal coupled to an output of logic gate 610, which includes an input to receive the mode select signal MS[0,1]. Referring also to FIG. 7, for one embodiment, logic gate 610 is an OR gate 702 having inputs to receive MS[0] and MS[1] and an output to provide a select signal SEL to MUX 608. In this manner, if both MS[0] and MS[1] are logic low, OR gate 702 provides a logic low SEL to MUX 608, which in turn provides the signal CNT[0,1] from counter 606 as the control signal GC[0,1] to decoder 612. Conversely, if either MS[0] or MS[1] is logic high, OR gate 702 provides a logic high SEL to MUX 608, which in turn provides the mode select bits MS[0,1] as GC[0,1] to decoder 612.

Decoder 612 includes inputs to receive GC[0,1] from MUX 608 and outputs to provide the tuning range control signals TRS[0] and TRS[1] to VCO 340. For a preferred embodiment, the decoding function performed by decoder 612 is summarized in table 3 below. It is to be understood that numerous logic circuits may be used to implement the logic function illustrated in Table 3 (including alternatives that logically complement one or more of the signals), and therefore specific circuit configurations of decoder 612 are not provided herein so as to not unneccessarily obscure the invention.

TABLE 3

| GC[0, 1] | tuning range | TRS[0] | TRS[1] |
|---|---|---|---|
| 00 | not used | not used | not used |
| 01 | lower | 1 | 1 |
| 10 | middle | 0 | 1 |
| 11 | upper | 0 | 0 |

An exemplary operation of controller 600 is described below with respect to the state diagram of FIG. B. For this example, MS[0,1]=00 so that controller 600 operates in the automatic mode. Further, for the discussion that follows, controller 600 is initialized to select the middle tuning range 502 by setting TRS[0]=0 and TRS[1]=1. Note, however, that for actual embodiments, controller 600 may initialize VCO 340 to any of the tuning ranges. For one preferred embodiment, controller 600 initializes VCO 340 to the lower tuning range 501.

For the exemplary operation, FSM 604 starts in state 801 and de-asserts its output signals SH_up, SH_dn, and RST. If sampling circuit 602 asserts its output UP, which indicates that V_ctrl has exceeded $V_H$ for a predetermined number of clock cycles, FSM 604 transitions to state 802, which causes VCO 340 to transition to the next higher tuning range. Specifically, while in state 802, FSM 604 asserts SH_up (e.g., to logic high), which instructs counter 606 to increment itself, and thus its output signal CNT[0,1] by one to achieve a new value of CNT[0,1]=11. Because MS[0,1]=00, MUX 608 passes CNT[0,1] as GC[0,1] to decoder 612. In response to GC[0,1]=11, decoder 612 de-asserts TRS[0] and TRS[1] which, as described above, turns off corresponding switches SW0 and SW1 of tank circuit 400 (see also FIG. 4) and thereby transitions VCO 340 to the upper tuning range 503. Further, upon transitioning to state 802, FSM 604 asserts RST to logic high which, as discussed above, instructs loop filter 330 to set V_ctrl equal to $V_M$. In this manner, when controller 600 instructs VCO 340 to transition to the upper tuning range 503, the VCO output signal $f_{VCO}$ is initially set to the middle of the upper tuning range 503 (e.g., $f_{VCO} \approx f_{CH}$).

Thereafter, if the lock detect signal LD is asserted (e.g., to logic high), FSM 604 locks the current state of the tuning range control signals TRS, and transitions to state 801. Otherwise, if the lock detect signal LD is not asserted (e.g., to logic low), FSM 604 transitions to state 803.

Conversely, if sampling circuit 602 asserts its output DN while FSM 604 is in state 801, which indicates that V_ctrl has dropped below $V_L$ for a predetermined number of clock cycles, FSM 604 transitions to state 804, which causes VCO 340 to transition to the next lower tuning range. Specifically, while in state 804, FSM 604 asserts SH_dn (e.g., to logic high), which instructs counter 606 to decrement itself, and thus its output signal CNT[0,1] by one to achieve a new value of CNT[0,1]=01. Because MS[0,1]=00, MUX 608 passes CNT[0,1] as GC[0,1] to decoder 612. In response to GC[0,1]=01, decoder 612 asserts TRS[0] and TRS[1] which, as described above, turns on corresponding switches SW0 and SW1 of tank circuit 400 and thereby transitions VCO 340 to the lower tuning range 501. Further, upon transitioning to state 804, FSM 604 asserts RST to logic high which, as discussed above, instructs loop filter 330 to set V_ctrl equal to $V_M$. In this manner, when controller 600 instructs VCO 340 to transition to the lower tuning range 501, the VCO output signal $f_{VCO}$ is initially set to the middle of the tuning range 501 (e.g., $f_{VCO} \approx f_{CL}$).

Thereafter, if the lock detect signal LD is asserted (e.g., to logic high), FSM 604 locks the current state of the tuning range control signals TRS, and transitions to state 801. Otherwise, if the lock detect signal LD is not asserted (e.g., logic low), FSM 604 transitions to state 803.

In state 803, FSM de-asserts SH_up and SH_dn (e.g., to logic low), which in turn prevents VCO 340 from changing tuning ranges. FSM 604 continues to assert RST to logic high until sampling circuit 602 asserts MID (e.g., to logic high) to indicate that V_ctrl=$V_M$. When MID is de-asserted, FSM de-asserts RST (e.g., to logic low) to allow V_ctrl to be adjusted in response to the control signals output from charge pump 320 and thereby adjust $f_{VCO}$ within the selected tuning range.

Figure 9:
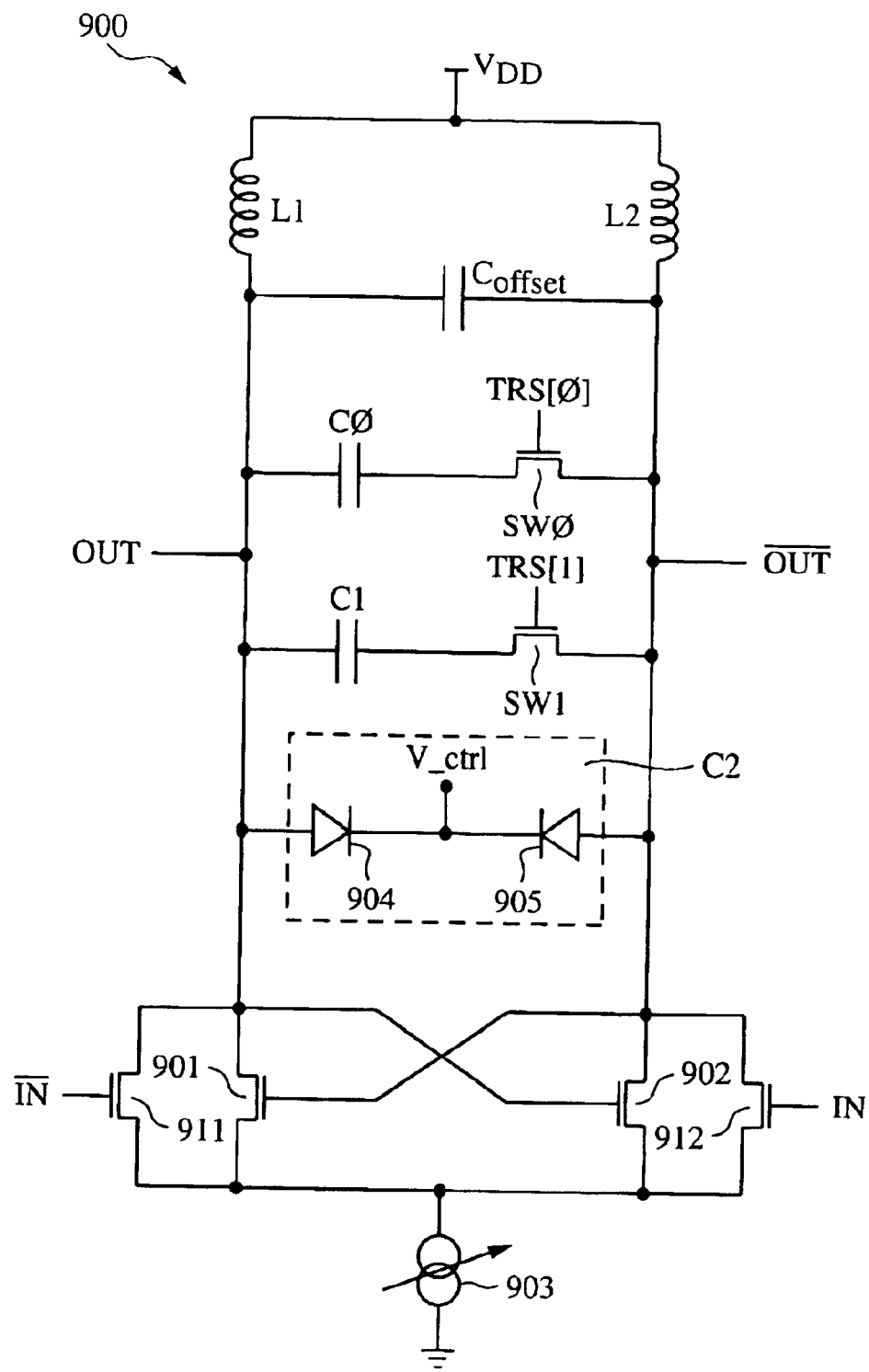
FIG. 9 is a simplified schematic diagram of one embodiment of the VCO for the PLL circuit of FIG. 3.

FIG. 9 shows a VCO 900 that is one embodiment of VCO 340 of FIG. 3. VCO 900 is a differential oscillator that provides complementary output oscillation signals OUT and $\overline{OUT}$ that are 180 degrees out of phase with respect to one another. VCO 900 includes a differential pair formed by NMOS transistors 901 and 902 and biased by a tunable current source 903. Current source 903 may be any well-known current source that may be programmed or tuned to provide a desired bias current, for example, depending upon temperature and process variations. For some embodiments, the bias current is provided by a well-known current mirror circuit having a plurality of selectively enabled current mirror transistors to provide the adjustable bias current for transistors 901 and 902.

NMOS transistor 901 is connected between output OUT and current source 903, and has a gate connected to output $\overline{OUT}$. NMOS transistor 902 is connected between output $\overline{OUT}$ and current source 903, and has a gate connected to output OUT. Because transistors 901 and 902 are connected as cross-coupled loads, transistor 901 turns on while transistor 902 turns off to pull-down OUT while pulling-up $\overline{OUT}$, and transistor 902 turns on while transistor 901 turns off to pull-down $\overline{OUT}$ while pulling-up OUT, thereby creating complementary oscillations at output nodes OUT and $\overline{OUT}$.

In addition, for preferred embodiments, NMOS transistors 911 and 912 are connected in parallel across NMOS transistors 901 and 902, respectively. NMOS transistor 911 has a gate to receive an input signal $\overline{IN}$, and NMOS transistor 912 has a gate to receive a complementary input signal IN, where IN and $\overline{IN}$ are 180 degrees out of phase. As described in more detail below with respect to FIG. 10, NMOS transistors 911 and 912 allow two VCO circuits 900 to be cascaded together to provide a four-phase oscillation output signal. For some embodiments, NMOS transistors 901 and 902 are much larger (e.g., have a much greater current-carrying capacity) than NMOS transistors 911 and 912. For one embodiment, NMOS transistors 901/902 and 911/912 are scaled as 9:1. For other embodiments, NMOS transistors 911 and 912 may be omitted.

A first inductor L1 is connected between the voltage supply $V_{DD}$ and OUT, and a second inductor L2 is connected between $V_{DD}$ and $\overline{OUT}$. For some embodiments, inductors L1 and L2 are well-known spiral inductors implemented using CMOS technology. For one embodiment, inductors L1 and L2 have an inductance of approximately 0.5 nH. An offset capacitor $C_{offset}$ is connected between outputs OUT and $\overline{OUT}$. Offset capacitor $C_{offset}$, which for some embodiments has a capacitance of approximately 1 pF, provides a frequency offset for VCO 900 of approximately 5 GHz.

A first selectable capacitor C0 and switch SW0 are connected in series between OUT and $\overline{OUT}$. A second selectable capacitor C1 and switch SW1 are connected in series between OUT and $\overline{OUT}$. As shown in FIG. 9, switches SW0 and SW1 are NMOS transistors having gates to receive TRS[0] and TRS[1], respectively, although for other embodiments any suitable switches may be used. For some embodiments, capacitors C0 and C1 have the same capacitance, although for other embodiments different capacitances may be used.

The variable capacitance C2 is formed by using back-to-back varactor diodes 904 and 905 connected between OUT and $\overline{OUT}$, with the control voltage V_ctrl applied between the varactor diodes 904 and 905. The capacitance generated by the varactor diodes 904 and 905 is created by the depletion regions formed by the reverse-biased PN junctions in the diodes, where the depletion regions in the diodes effectively form the dielectric of the capacitor. Varactor diodes 904 and 905 are well-known and may be formed, for example, using CMOS transistors. Because of the differential output signal between OUT and $\overline{OUT}$, one of the varactor diodes 904 and 905 will always be reverse-biased, and thus the series connection of diodes 904 and 905 exhibits a capacitance characteristic as long as V_ctrl remains above OUT and $\overline{OUT}$. The capacitance of varactor 904/905 may be changed in response to V_ctrl, thereby allowing adjustments to V_ctrl to tune the output frequency of the VCO 900.

Together, inductors L1 and L2 and capacitors $C_{offset}$, C0, C1, and C2 form an LC tank circuit that is one embodiment of tank circuit 400 of FIG. 4 and which has a resonant frequency $f_o$ given by the expression:

$$fo = \frac{1}{2\pi\sqrt{LC}},$$

where C represents the effective capacitance of the tank circuit and L represents the effective inductance of the tank circuit. For the embodiment of FIG. 9, L is equal to the parallel combination of inductances L1 and L2, i.e., $$L = \frac{L1 * L2}{L1 + L2},$$

and C is equal to the selectable parallel combination of capacitors $C_{offset}$, C0, C1, and C2.

As described above, the tuning range control signals TRS[0] and TRS[1] may be selectively asserted to effect large changes in C and thereby select one of the three frequency ranges 501–503 for VCO 900. Once a tuning range is selected, V_ctrl may be adjusted to tune $f_{VCO}$ along the selected tuning range to synchronize $f_{VCO}$ with $f_{REF}$.

Figure 10:
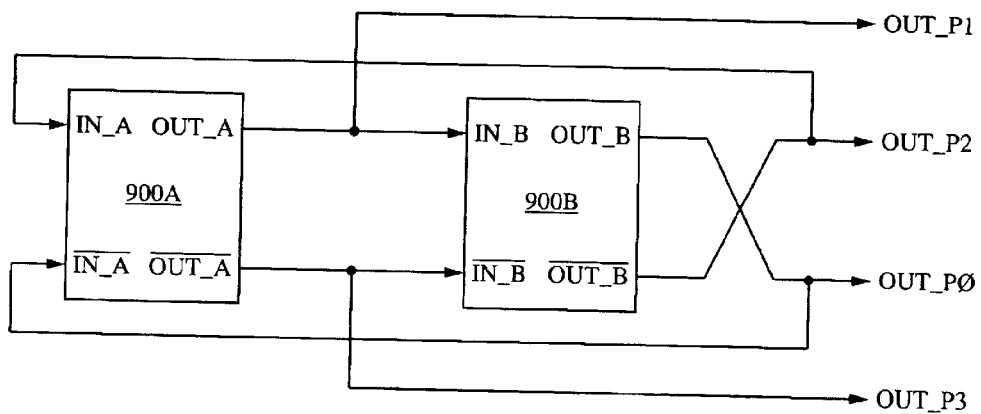
FIG. 10 is a simplified block diagram of another embodiment of the VCO for the PLL circuit of FIG. 3.

FIG. 10 shows a VCO 1000 that is another embodiment of the VCO 340 of FIG. 3. VCO 1000 is a four-phase differential oscillator circuit that includes two cross-coupled VCO circuits 900A and 900B, where circuits 900A and 900B are identical embodiments of VCO 900 of FIG. 9. Thus, the outputs OUT_A and $\overline{\text{OUT\_A}}$ of VCO 900A are coupled to the respective inputs IN_B and $\overline{\text{IN\_B}}$ of VCO 900B, and the outputs OUT_B and $\overline{\text{OUT\_B}}$ of VCO 900B are coupled to the respective inputs $\overline{\text{IN\_A}}$ and IN_A of VCO 900A. In this manner, VCO 1000 provides four oscillation output frequencies OUT_P1, OUT_P2, OUT_P3, and OUT_P4, where OUT_P2 is 90 degrees out of phase with respect to OUT_P1, OUT_P3 is 180 degrees out of phase with respect to OUT_P1, and OUT_P4 is 270 degrees out of phase with respect to OUT_P1.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For example, although described below with respect to an exemplary driver circuit, termination resistor circuits described herein may be used in other integrated circuits.

What is claimed is:

1. A phase-locked loop (PLL) circuit, comprising:
   a voltage-controlled oscillator (VCO) having a first input to receive a control voltage, one or more second inputs to receive one or more tuning range signals, and an output to provide an oscillation output signal;
   a phase detector having inputs to receive the oscillation output signal and a reference signal, and having an output;
   a charge pump having an input coupled to the output of the phase detector and having an output to generate the control voltage;
   a loop filter having an input to receive the control voltage and having a control terminal; and
   a control circuit having inputs to receive the control voltage, a high reference voltage, a low reference voltage, and one or more mode signals, and having a first output connected to the control terminal of the loop filter and second outputs to generate the tuning range signals, wherein the control circuit is configured to automatically generate the tuning range signals when the mode signals are set to a first state.

2. The PLL circuit of claim 1, wherein the one or more tuning range signals select one of a plurality of tuning ranges for the VCO.

3. The PLL circuit of claim 1, wherein one or more of the tuning ranges overlaps an adjacent tuning range.

4. The PLL circuit of claim 1, wherein the one or more tuning range signals are generated in response to comparisons between the control voltage and the reference voltages.

5. The PLL circuit of claim 4, wherein the one or more tuning range signals instruct the VCO to select a higher tuning range if the control voltage is greater than the high reference voltage.

6. The PLL circuit of claim 4, wherein the one or more tuning range signals instruct the VCO to select a lower tuning range if the control voltage is less than the low reference voltage.

7. The PLL circuit of claim 1, wherein the mode signals are set to a second state and control the one or more tuning range signals.

8. The PLL circuit of claim 7, wherein the mode signals are generated externally and provided as input signals to the PLL circuit.

9. The PLL circuit of claim 1, wherein the VCO comprises a differential oscillator circuit having:
   a first transistor coupled between a first output terminal and a bias node, and having a gate coupled to a second output terminal;
   a second transistor coupled between the second output terminal and the bias node, and having a gate coupled to the first output terminal; and
   a resonant circuit coupled between the first and second output terminals, and comprising:
   an offset capacitor coupled between the first and second output terminals;
   a first capacitor and a first switch connected in series between the first arid second output terminals, the first switch controlled by a first tuning range signal;
   a second capacitor and a second switch connected in series between the first and second output terminals, the second switch controlled by a second tuning range signal; and
   a varactor coupled between the first and second output terminals, the varactor including a terminal to receive the control voltage.

10. The PLL circuit of claim 9, wherein the differential oscillator circuit further comprises:
    a third transistor connected in parallel with the first transistor and having a gate to receive a first input signal; and
    a fourth transistor connected in parallel with the second transistor and having a gate to receive a second input signal.

11. The PLL circuit of claim 10, wherein the first and second input signals are 180 degrees out of phase.

12. The PLL circuit of claim 10, wherein the VCO further comprises two of the differential oscillator circuits connected in a cascade configuration to provide a four-phase oscillation output.

13. The PLL circuit of claim 1, wherein the control circuit comprises:
    a comparator circuit having a first input to receive the high reference voltage, a second input to receive the low reference voltage, a third input to receive a middle reference voltage, and outputs to generate a plurality of corresponding compare signals; and
    a controller having first inputs to receive the compare signals, and having first outputs to generate the one or more tuning range signals in response to the compare signals.

14. The PLL circuit of claim 13, wherein the comparator comprises hysteresis.

15. The PLL circuit of claim 13, wherein the controller comprises:
    a finite state machine having inputs responsive to the compare signals;
    a counter having inputs coupled to first outputs of the finite state machine, and having an output to generate a counter signal;
    a multiplexer having a first input to receive the counter signal, a second input to receive the one or more mode signals, a control terminal to receive a logic combination of the one or more mode signals, and an output; and a decoder having an input coupled to the output of the multiplexer and having an output to provide the tuning range signals to the VCO.

16. The PLL circuit of claim 13, wherein the control terminal of the loop filter is configured to receive a reset signal generated by the controller.

17. The PLL circuit of claim 16, wherein assertion of the reset signal causes the loop filter to reset the control voltage to a predetermined value.

18. The PLL circuit of claim 16, wherein the reset signal is asserted in response to a change in the tuning range signals.

19. A phase-locked loop (PLL) circuit, comprising:
a voltage-controlled oscillator (VCO) having a first input to receive a control voltage, a second input to receive a tuning range signal that configures the VCO to one of a plurality of adjacent tuning ranges, and an output to provide an oscillation output signal;
a phase detector having inputs to receive the oscillation output signal and a reference signal, and having an output;
a charge pump and loop filter circuit having an input coupled to the output of the phase detector, an output to generate the control voltage, and a control terminal to receive a reset signal; and
a control circuit for automatically generating the tuning range signal in response to a comparison between the control voltage and a plurality of reference voltages when a mode signal is set to a first state.

20. The PLL circuit of claim 19, wherein the control circuit comprises:
a comparator circuit having a first input to receive a high reference voltage, a second input to receive a low reference voltage, a third input to receive a middle reference voltage, and outputs to generate a plurality of corresponding compare signals;
a finite state machine having first inputs responsive to the compare signals, having first outputs to generate a shift up signal and a shift down signal, and having a second output to generate the reset signal;
a counter having inputs to receive the shift up and shift down signals, and having an output to generate a counter signal;
a multiplexer having a first input to receive the counter signal, a second input to receive a mode signal, a control terminal to receive a select signal, and an output; and
a decoder having an input coupled to the output of the multiplexer and having an output to provide the tuning range signal to the VCO.

21. The PLL circuit of claim 20, wherein the select signal comprises the mode signal.

22. The PLL circuit of claim 19, wherein the reset signal is generated in response to the comparison between the control voltage and the plurality of reference voltages.

23. The PLL circuit of claim 19, wherein setting the mode signal to a second state configures the control circuit to adjust the tuning range signal in response to the mode signal.

24. The PLL circuit of claim 23, wherein the mode signal is generated externally and provided as an input signal to the PLL circuit.

25. The PLL circuit of claim 19, wherein the charge pump and loop filter circuit selectively resets the control voltage to a predetermined voltage in response to the reset signal.

26. The PLL circuit of claim 19, wherein the VCO comprises a differential oscillator circuit having:

a first transistor coupled between a first output terminal and a bias node, and having a gate coupled to a second output terminal;
a second transistor coupled between the second output terminal and the bias node, and having a gate coupled to the first output terminal; and
a resonant circuit coupled between the first and second output terminals, and comprising:
an offset capacitor coupled between the first and second output terminals;
a first capacitor and a first switch connected in series between the first and second output terminals, the first switch controlled by a first tuning range signal;
a second capacitor and a second switch connected in series between the first and second output terminals, the second switch controlled by a second tuning range signal; and
a varactor coupled between the first and second output terminals, the varactor including a terminal to receive the control voltage.

27. The PLL circuit of claim 26, wherein the differential oscillator circuit further comprises:
a third transistor connected in parallel with the first transistor and having a gate to receive a first input signal; and
a fourth transistor connected in parallel with the second transistor and having a gate to receive a second input signal.

28. The PLL circuit of claim 27, wherein the first and second input signals are 180 degrees out of phase.

29. The PLL circuit of claim 27, wherein the VCO further comprises two of the differential oscillator circuits connected in a cascade configuration to provide a four-phase oscillation output.

30. A method of operating a phase-locked loop (PLL) circuit having a plurality of substantially adjacent frequency tuning ranges, comprising:
configuring the circuit to initially operate in a selected frequency tuning range;
generating an oscillation output signal;
comparing the oscillation output signal with a reference signal to generate a control voltage;
comparing the control voltage to first and second reference voltages to generate a compare signal, wherein the first reference voltage is less than the second reference voltage; and
selectively changing the frequency tuning range in response to the compare signal, wherein the selectively changing further comprises:
selecting a lower frequency tuning range if the control voltage is less than the first reference voltage;
selecting a higher frequency tuning range if the control voltage is greater than the second reference voltage; and
locking the selected frequency tuning range if the control voltage is between the first and second reference voltages.

31. The method of claim 30, further comprising:
asserting a reset signal if the frequency tuning range is changed; and
resetting the control voltage to a predetermined value in response to the reset signal.

32. The method of claim 30, further comprising:
providing a mode signal to the circuit;

allowing the circuit to automatically select a frequency tuning range if the mode signal is in a first state; and instructing the circuit to select a particular frequency tuning range indicated by the mode signal if the mode signal is in a second state.

33. The method of claim 30, wherein the selectively changing further comprises:

asserting a shift-up signal if the control voltage is less than the first reference voltage;

asserting a shift-down signal if the control voltage is greater than the second reference voltage;

incrementing a counter value in response to the shift-up and shift-down signals;

generating a tuning range signal in response to the counter value; and adjusting the frequency tuning range in response to the tuning range signal.

34. The method of claim 33, wherein the selectively changing further comprises:

providing an externally generated mode signal;

generating the tuning range signal in response to the counter value if the mode control signal is in a first state; and generating the tuning range signal in response to the mode signal if the mode signal is in a second state.

* * * * *

UNITED STATES PATENT AND TRADEMARK OFFICE
CERTIFICATE OF CORRECTION

PATENT NO. : 6,952,124 B2 Page 1 of 1
APPLICATION NO. : 10/662554
DATED : October 4, 2005
INVENTOR(S) : Hiep The Pham It is certified that error appears in the above-identified patent and that said Letters Patent is hereby corrected as shown below:

Title page, INID code (54), under Title section and Col. 1:

delete "HIEP THE PHAM"

Signed and Sealed this

Sixteenth Day of March, 2010

David J. Kappos
*Director of the United States Patent and Trademark Office*